United States Patent [19]
Porter

[11] Patent Number: 5,359,492
[45] Date of Patent: Oct. 25, 1994

[54] LATCH ASSEMBLY FOR MODULAR COMPUTER COMPONENT

[75] Inventor: Warren W. Porter, Escondido, Calif.

[73] Assignee: NCR Corporation, Dayton, Ohio

[21] Appl. No.: 921,160

[22] Filed: Jul. 29, 1992

[51] Int. Cl.⁵ .................. H05K 7/10; H01R 13/627
[52] U.S. Cl. .................. 361/683; 361/726; 361/732; 292/85; 439/357; 439/490
[58] Field of Search .................. 439/344, 352–354, 439/357, 358, 488, 490, 491; 312/223.1, 223.2, 223.5, 332.1, 333; 361/679–686, 724–727, 732, 754, 759, 798; 385/134, 135, 147, 901; 362/32

[56] References Cited

U.S. PATENT DOCUMENTS

| | | |
|---|---|---|
| 2,609,268 | 9/1952 | Nye .................. 312/333 X |
| 3,853,379 | 12/1974 | Goodman et al. . |
| 4,232,356 | 11/1980 | Saunders et al. . |
| 4,914,550 | 4/1990 | Filsinger et al. . |
| 4,922,125 | 5/1990 | Casanova et al. . |
| 4,947,289 | 8/1990 | Dynie . |
| 4,982,303 | 1/1991 | Krenz . |
| 4,996,631 | 2/1991 | Freehauf . |
| 5,045,960 | 9/1991 | Eding . |
| 5,068,652 | 11/1991 | Kobayashi .................. 361/680 X |
| 5,202,197 | 4/1993 | Ausell et al. .................. 429/97 |

Primary Examiner—Leo P. Picard
Assistant Examiner—Michael W. Phillips
Attorney, Agent, or Firm—James M. Stover

[57] ABSTRACT

The present invention provides a modular computer component that inserts into a computer housing. Upon insertion, the component automatically interconnects with a computer in communication with the housing, and the component automatically latches in place relative to the housing. The component can be single-handedly, contemporaneously unlatched from the computer housing, disconnected from a computer in communication with the computer housing, and removed from the computer housing. A latch body secures to the component, and a light conduit conducts light through a portion of the latch body. The mechanism for unlatching the component assumes a standard position relative to the latch body independent of the bias force exerted by the means for latching the component.

7 Claims, 6 Drawing Sheets

LATCH ASSEMBLY FOR MODULAR COMPUTER COMPONENT

FIELD OF THE INVENTION

The present invention relates to a latch assembly for releasably securing a modular computer component relative to a computer housing.

BACKGROUND OF THE INVENTION

A modular computer component is a self-contained assembly dedicated to a specific function and designed to integrate into a computer system. Those skilled in the art will recognize several advantages of providing computer components in modular form. For example, modular computer components can be mass produced for use in a variety of computer systems, whereas hardwired computer components are built into one specific embodiment. Similarly, a single computer system can be designed to receive various combinations of modular computer components that customize the system for specific applications. Additionally, in the event of a system failure, each modular computer component can be readily tested apart from the system, and a faulty module can be readily removed for repair or replacement.

Those skilled in the art will also recognize the desirability of providing modular computer components in the form of customer replaceable units, which allow the consumer or end user to remove and replace items such as batteries, fans, printed circuit boards, and memory components. For example, if a customer wishes to enhance the graphics capability of his computer, he can simply purchase an appropriate modular computer component and install it into an appropriate slot in his computer system. In the event of a fan failure, the customer can simply remove the faulty modular computer component from the computer housing to effect repair or replacement. Customer replaceable units not only minimize the expense and inconvenience inherent in computer system upgrades and repairs, but they also serve a psychological purpose by more intimately involving the consumer or end user in the operation and maintenance of his computer.

The success of customer replaceable units depends upon easy and reliable installation and removal of the units relative to the computer housing. They must be incapable of improper installation, and the customer must be completely comfortable with the installation and removal processes. Ideally, customer replaceable units should simply insert into a computer housing and automatically interconnect with the computer and latch in place. The units should also provide a signal that confirms proper installation by indicating when the component is activated. Additionally, a customer replaceable unit should be designed to be single-handedly, contemporaneously unlatched from the housing, disconnected from the computer, and removed from the computer housing.

Although modular computer components should be releasably secured to the computer housing, the latching mechanism should prevent any movement of the interconnected component relative to the computer housing. Additionally, customer replaceable units should be interchangeable, and some allowance should be provided for manufacturing tolerances. Yet, for aesthetic purposes, a latched unit should present a standard appearance regardless of such tolerances and independent of variable bias in the latching mechanism.

SUMMARY OF THE INVENTION

According to one embodiment, the present invention provides a modular computer component that inserts into a computer housing. Upon insertion, the component automatically interconnects with a computer in communication with the housing, and the component automatically latches in place relative to the housing.

According to another embodiment, the present invention provides a modular computer component that latches relative to a computer housing. The component can be single-handedly, contemporaneously unlatched from the computer housing, disconnected from a computer in communication with the computer housing, and removed from the computer housing.

According to another embodiment, the present invention provides a latch assembly that releasably secures a modular computer component relative to a computer housing. The latch assembly includes a latch body that secures to the component, and a light conduit that conducts light through a portion of the latch body.

According to another embodiment, the present invention provides a latch assembly that releasably latches a modular computer component relative to a computer housing. The latch assembly includes a latch body that secures the latch assembly to the component, as well as latching means and unlatching means. The means for unlatching the component assumes a standard position relative to the latch body independent of the bias force exerted by the means for latching the component.

The present invention also provides a method of replacing a modular computer component that is latched relative to a computer housing and interconnected with a computer in communication with the housing. A first force is exerted upon a latch release mechanism on the component to unlatch the component from the housing. A second force is exerted upon a handle on the component to disconnect the component from the computer and remove the component from the housing. The first and second forces are exerted contemporaneously with a single hand. A replacement modular computer component is inserted into the housing to automatically interconnect the replacement component with the computer and latch the replacement component relative to the housing.

The advantages of the present invention will become apparent to those skilled in the art upon a more detailed description of a preferred embodiment.

BRIEF DESCRIPTION OF THE DRAWING

Referring to the Figures, wherein like numerals represent like parts throughout the several views.

DETAILED DESCRIPTION OF A PREFERRED EMBODIMENT

Figure 1:
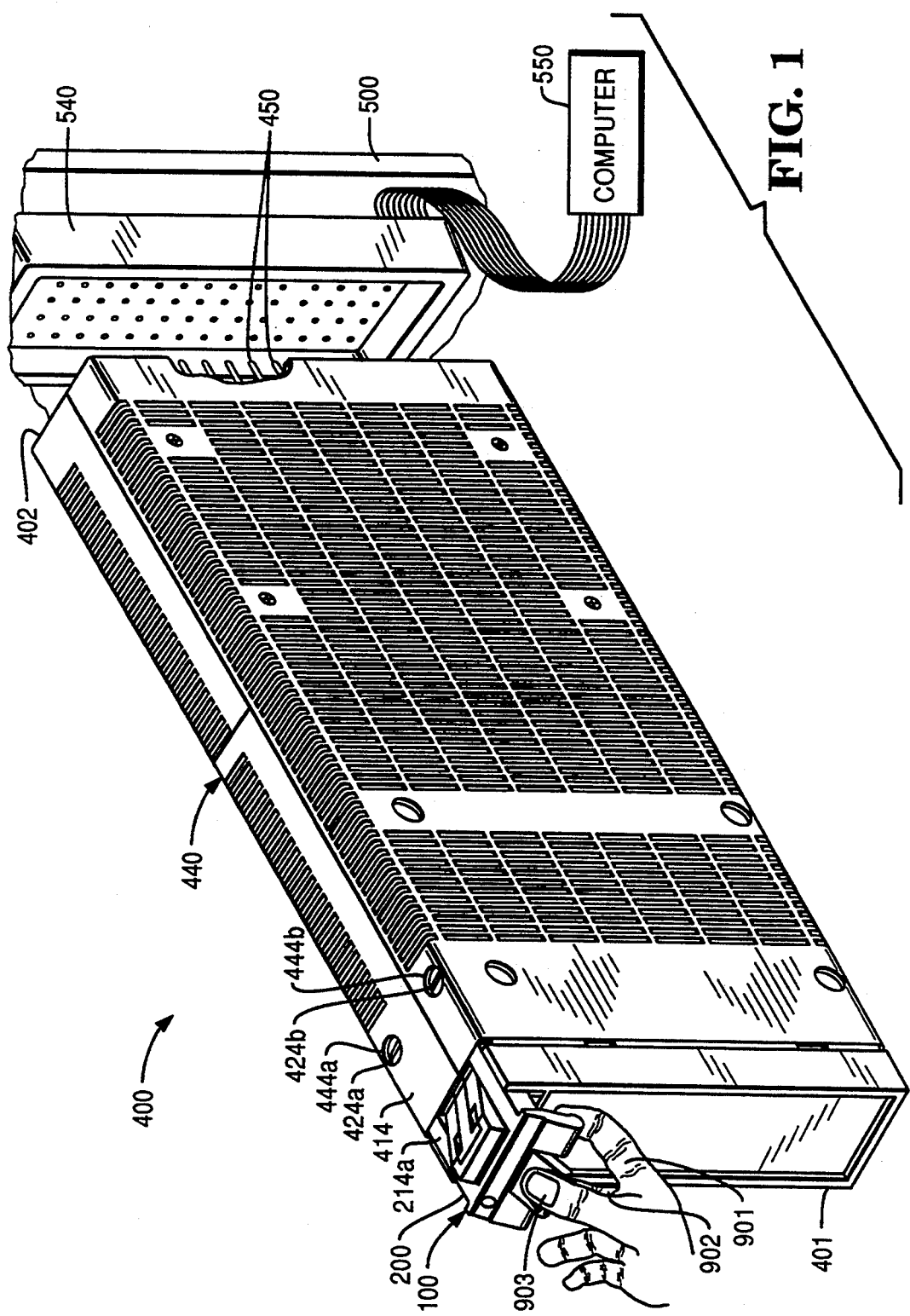
FIG. 1 is a perspective view of a modular computer component constructed according to the principles of the present invention.
Figure 2:
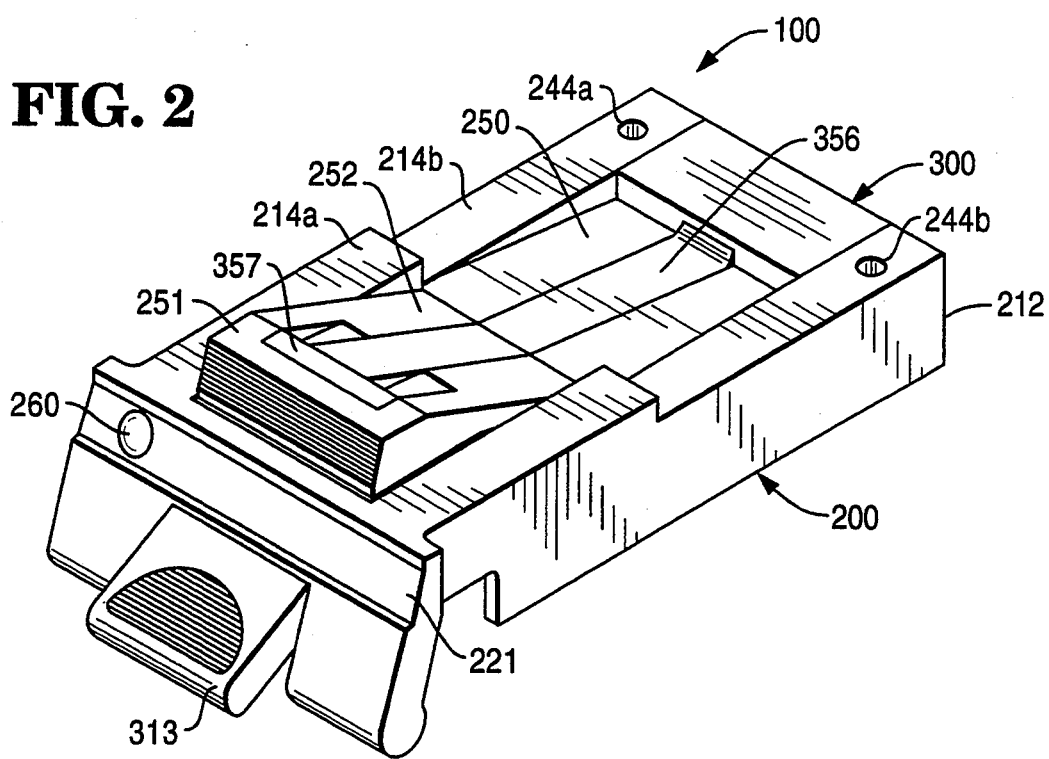
FIG. 2 is a first perspective view of a latch assembly secured to the modular computer component shown in FIG. 1.
Figure 3:
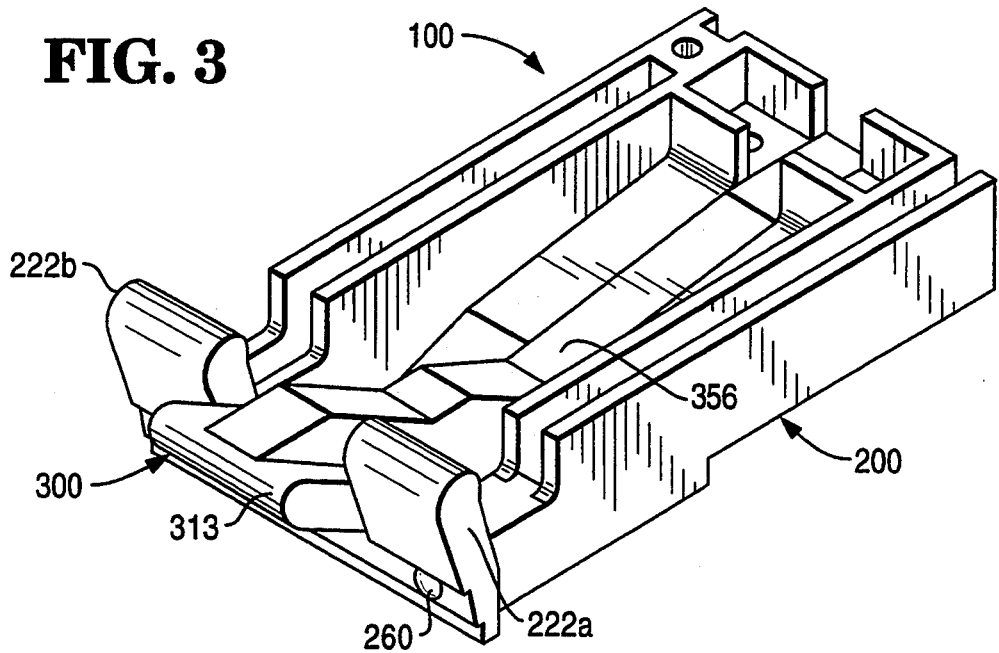
FIG. 3 is a second perspective view of the latch assembly shown in FIG. 2.

As shown in FIG. 1, a preferred embodiment of a modular computer component constructed according to the principles of the present invention is designated generally as 400. For purposes of discussion, the component 400 is a media disc, but those skilled in the art will recognize that the principles of the present invention apply to modular computer components in general, including batteries, fans, printed circuit boards, and memory units. A latch assembly 100 releasably secures the component 400 relative to a computer housing (as shown in FIGS. 7A-7E). As shown in FIGS. 2 and 3, the latch assembly 100 includes a latch body 200 and a latch operator 300.

The latch body 200 will be described with reference to integral first and second segments, designated as 210 and 220, respectively, in FIGS. 4 and 5. The first segment 210 extends from a front end 211 to a rear end 212 and has substantially parallel sidewalls 213a and 213b. A top portion of the first segment 210 defines first and second interface surfaces 214a and 214b, respectively, that are substantially perpendicular to the sidewalls 213a and 213b.

As shown in FIG. 1, the latch body 200 is secured to one side 414 of the modular computer component 400. The first interface surface 214a is substantially flush with the side 414, and the second interface surface 214b lies directly beneath the side 414. Screws 424a and 424b pass through holes 444a and 444b in the side 414 and mate with threaded holes 244a and 244b, shown in FIG. 2, in the latch body 200 near the rear end 212.

The second segment 220 of the latch body 200 is integrally joined to the front end 211 of the first segment 210, extending at an oblique angle relative to the first interface surface 214a. The second segment 220 functions as a front panel member 221 that includes a first flange 222a and a second flange 222b, defining a gap 223 therebetween. The flanges 222a and 222b provide support behind which a person can place one or more fingers in order to grasp and handle the modular unit to which the latch assembly 100 is secured. An aperture 260 is provided in the front panel 221 to allow for the passage of light outside the latch assembly.

A stop member 250 is cantilevered relative to the rear end 212 of the first segment 210 and includes resilient arm members 255a and 255b that are integrally joined to the rear end 212 and extend toward the front end 211. A forward portion of the stop member 250 extends above the first interface surface 214a to define a catch member 251. The catch member 251 includes a leading or first inclined surface 252 and a trailing or second inclined surface 253. The surfaces 252 and 253 may be described as inclined or oblique relative to the first interface surface 214a.

The leading surface 252 is relatively farther from and slopes away from the front end 211. The trailing surface 253 is relatively nearer to and slopes toward the front end 211. The surfaces 252 and 253 define the depth or thickness of the catch member 251 therebetween, which depth progressively decreases as a function of the height of the catch member 251 relative to the first interface surface 214a. The resilient nature of the arm members 255a and 255b allows the catch member 251 to deflect among a plurality of positions relative to the first interface surface 214a. The stop member 250 provides a means for latching the component 400 relative to a computer housing.

Figure 6:
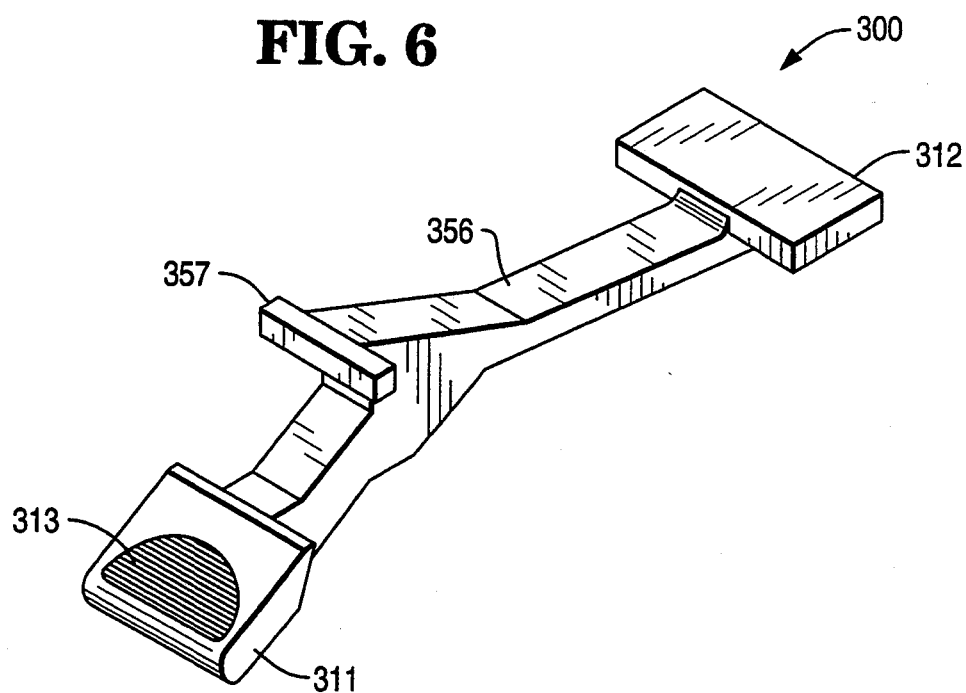
FIG. 6 is a perspective view a latch operator forming a part of the latch assembly shown in FIGS. 2 and 3.

The arm members 255a and 255b define a longitudinal slot 256 therebetween, which slot 256 extends substantially the entire length of the stop member 250. The slot 256 is occupied by a lever member 356 comprising a portion of the latch operator 300. As shown in FIG. 6, the lever member 356 extends between a front end 311 and a rear end 312 of the latch operator 300. The slot 256 in the stop member 250 proceeds into a recess 257 in the catch member 251. The recess 257 is occupied by an elevated crossbar 357 on the latch operator 300, which extends laterally from a central portion of the lever member 356.

The rear end 312 of the latch operator 300 is secured to the rear end 212 of the latch body 200 to cantilever the latch operator relative to the rear end 212 of the latch body. The front end 311 of the latch operator 300 extends through the gap 223 and includes a tab or operator member 313 to be manually operated in a manner described below. The spatial relationship between the crossbar 357 and the catch member 251 is such that downward movement of the crossbar 357 necessarily causes downward movement of the catch member 251, but downward movement of the catch member 251 does not cause downward movement of the crossbar 357. The latch operator 300 provides a means for unlatching the component 400 relative to a computer housing.

Figure 7A:
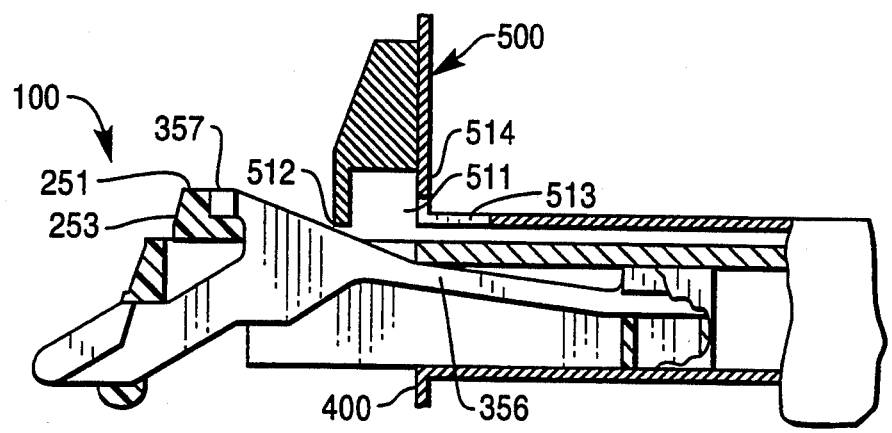
FIGS. 7A-7E are sectioned views of the latch assembly shown in FIGS. 2 and 3, illustrating the operation of the latch assembly relative to a computer housing.
Figure 7B:
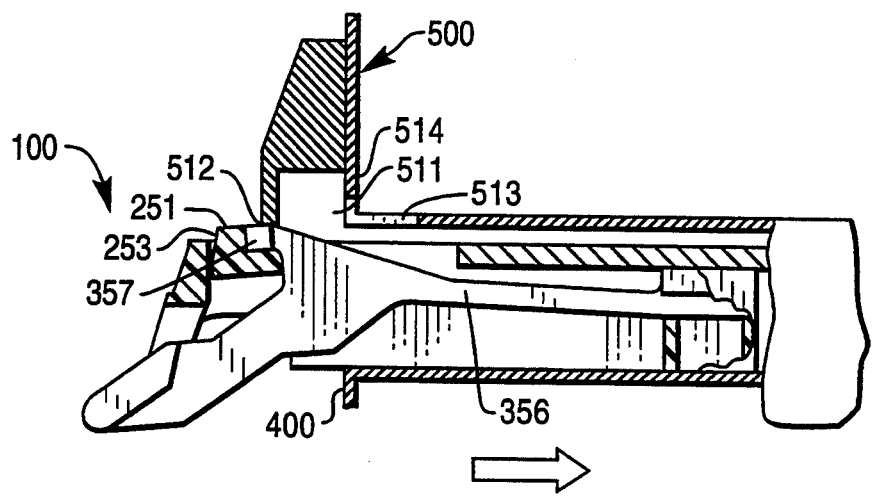

In FIGS. 7A-7E, the operation of the latch assembly 100 is shown in relation to a computer housing 500. As the component 400 is inserted into the computer housing 500, the leading surface 252 (as shown in FIGS. 2 and 4, not visible in FIGS. 7A-7E) and a portion of the lever member 356 contact a lip 512 that defines one wall of a notch 511 in the computer housing 500 (as shown in FIG. 7A). Due to resilient nature of the stop member 250 and the latch operator 300, the catch member 251 and the lever member 356 deflect away from the lip 512, allowing the further insertion of the component into the housing (as shown in FIG. 7B). Once the crossbar 357 passes beyond the first wall 512, the bias in the lever member 356 causes the crossbar 357 to deflect into the notch 511, and the lever member 356 to deflect into a void 513 in a second, opposing wall 514 of the notch 511.

Figure 4:
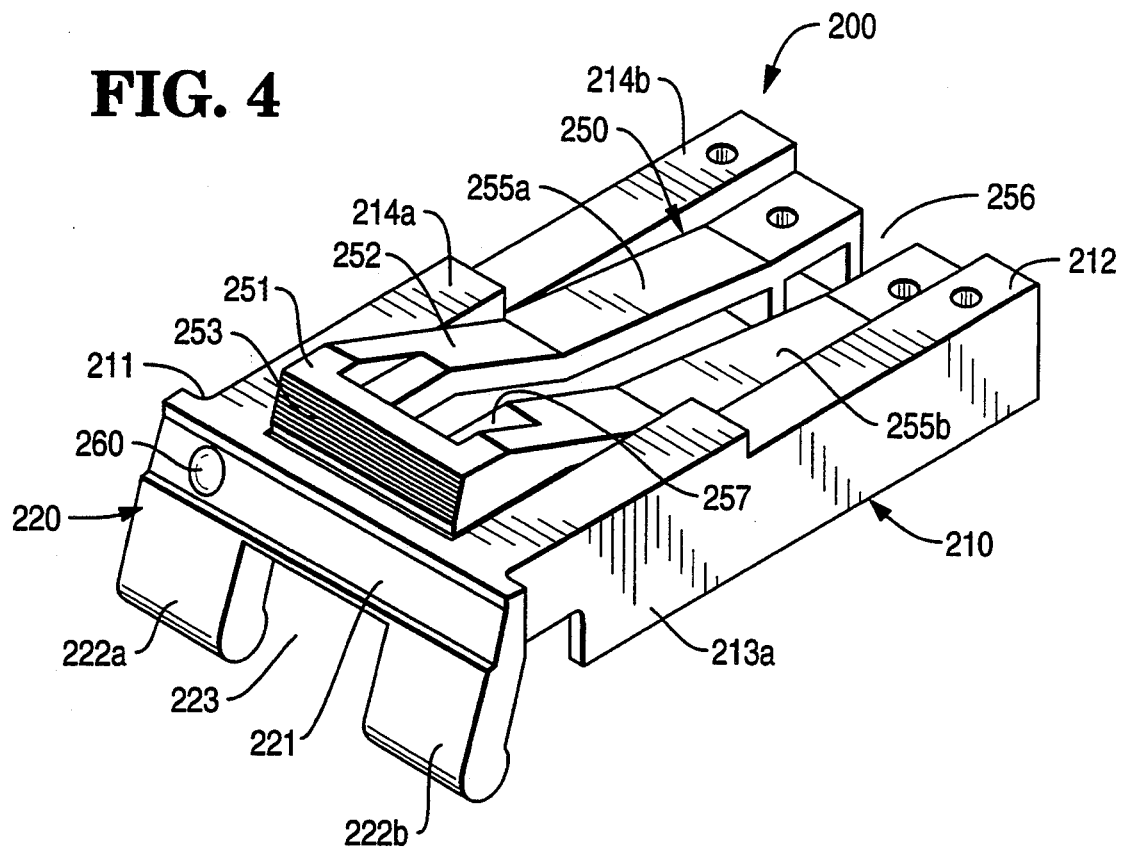
FIG. 4 is a first perspective view of a latch body forming a part of the latch assembly shown in FIGS. 2 and 3.
Figure 5:
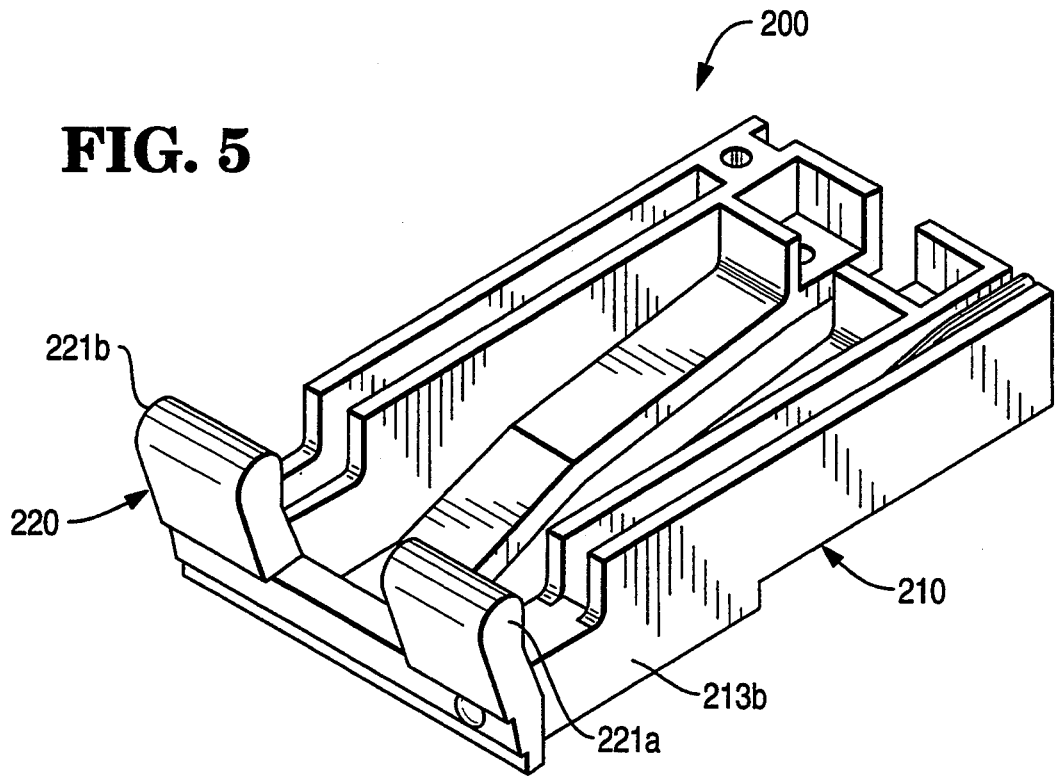
FIG. 5 is a second perspective view of the latch body shown in FIG. 4.
Figure 7C:
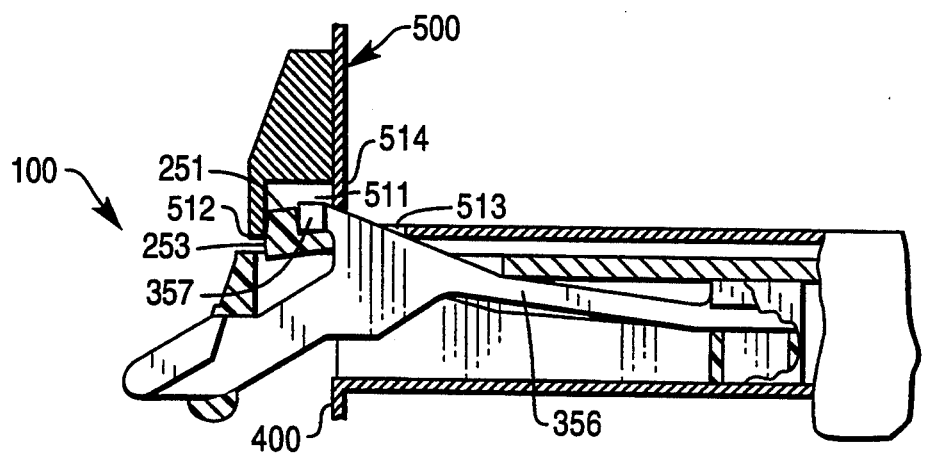

Upon further insertion, the trailing surface 253 passes beyond the lip 512, at which time the bias in the stop member 250 (as shown in FIGS. 2 and 4, not visible in FIGS. 7A-7E) urges the catch member 251 into the notch 511 (as shown in FIG. 7C). The trailing surface 253 is biased against the first notch wall 512 to prevent any undesired movement of the component relative to the housing. The trailing surface 253 is formed with a series of successive square edges designed to selectively engage the first notch wall 512 when the catch mechanism 251 protrudes into the notch 511. With reference back to FIG. 1, during the insertion process, an interconnecting plug 450 at the rear of the component 400 engages an interconnecting receptacle 540 at the rear of the computer housing 500. The receptacle 540 is in communication with a computer 550 that is serviced by the components within the housing 500. The length of the component relative to the length of the housing ensures that the component automatically interconnects with the computer, and also, prevents over-insertion of the component into the housing.

Figure 7D:
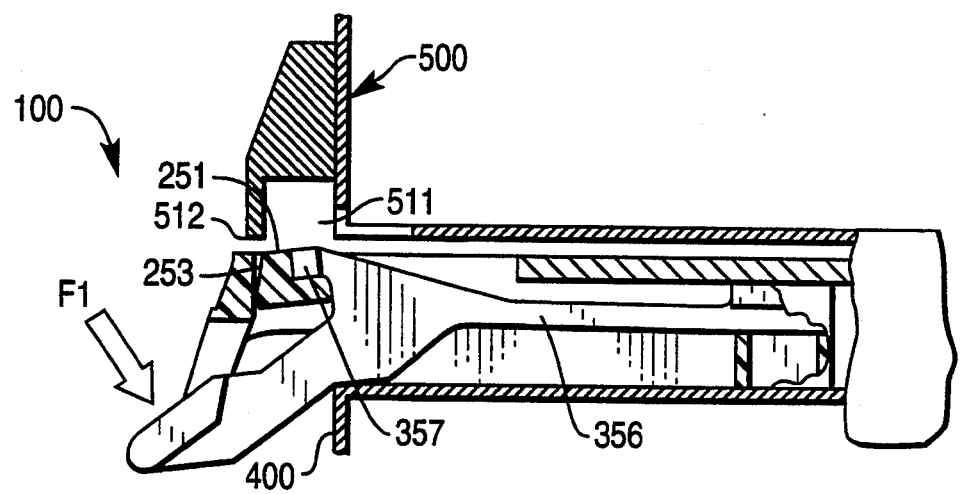
Figure 7E:
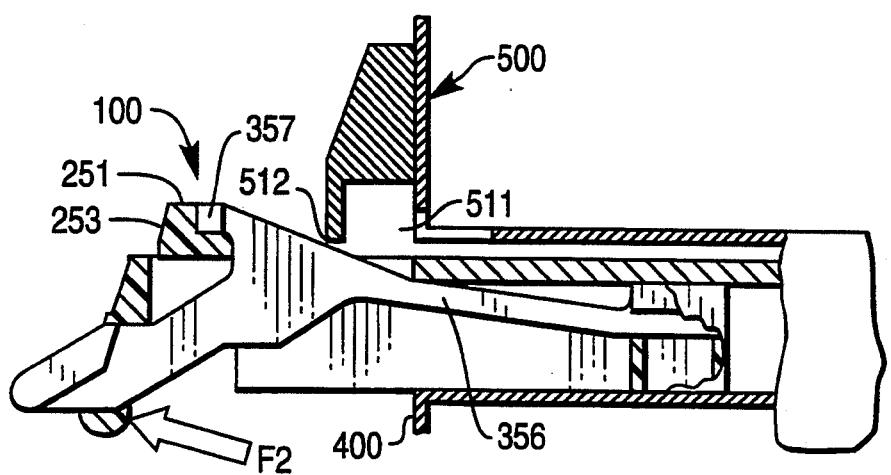

To remove the component 400 from the computer housing 500, a person places his forefinger 901 behind one flange 222b and his middle finger 902 behind the other flange 222a; pushes his thumb 903 against the tab 313 to exert a first force F1 that unlatches the component from the housing; and pulls against the flanges 222a and 222b to exert a second force F2 that disconnects the component from the computer and removes s the component from the housing (as shown in FIGS. 7D and 7E). The unlatching force F1 against the tab 313 translates into a force on the catch member 251 away from the notch 511, thereby pulling the trailing surface 253 out of engagement with the lip 512. The removal force F2 must be sufficient to pull the plug 450 out of engagement with the receptacle 540.

Figure 8:
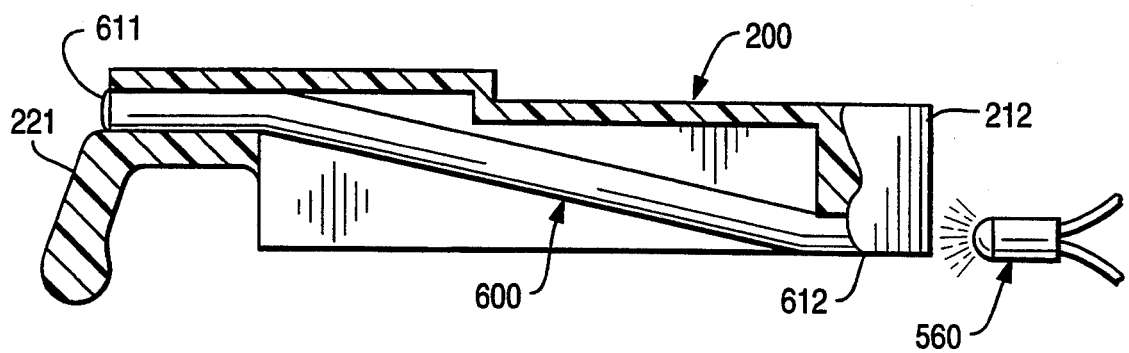
FIG. 8 is a sectioned view of the latch body shown in FIGS. 4 and 5, including a light conduit passing through a portion of the latch body.

As shown in FIG. 8, a transparent light conduit 600 passes through a portion of the latch body 200. The light conduit 600 conducts light from a source 560 within a computer housing to the exterior of the housing. The light conduit 600 extends from a front end 611 proximate the front panel 221 to a rear end 612 proximate the light source 560 at the rear end 212 of the latch body 200. The light conduit 600 is a translucent plastic member that is tinted yellow to make light exiting the front end 611 appear similar in color to light entering the rear end 612. In a preferred embodiment, the light indicates when the component is activated.

Those skilled in the art will recognize that the preceding description of a preferred embodiment was merely for purposes of illustration and explanation. Those skilled in the art will also recognize a variety of applications and modifications to the present invention that fall within the scope of the present invention. Thus, the present invention is to be limited only by the appended claims.

What is claimed is:

1. A computer assembly comprising:
   a computer housing including a notch, a first notch wall, and a second opposing notch wall;
   a modular computer component insertable into said housing; and
   a latch assembly that releasably latches said modular computer component relative to said computer housing, said latch assembly including:
   a latch body secured to the component;
   a resilient latching means, operatively connected to the latch body, said latching means including a catch member designed to resiliently engage the notch in the housing; and
   an unlatching means, operatively connected to the latch body and the latching means, for unlatching the latch body relative to the housing, said unlatching means being designed to urge the catch member out of biased engagement with said notch, wherein
   the unlatching means assumes a standard position relative to the latch body independent of bias force exerted by the latching means;
   the catch member and the unlatching means are cantilevered relative to a rear end of the latch body, and
   upon insertion of the component into the housing, leading surfaces on the catch member and the unlatching means contact the first notch wall in the housing, and
   upon further insertion of the component, the catch member and the unlatching means resiliently deflect away from the notch in response to contact with the first notch wall, and
   upon further insertion of the component, trailing surfaces on the catch member and the unlatching means pass the first notch wall, and
   due to resilient bias, the catch member and the unlatching means deflect into the notch, and
   the leading surface on the catch member contacts the second, opposing notch wall in the housing that prevents the catch member from resuming its unbiased position, but the leading surface on the unlatching means deflects into a recess in the second notch wall that allows the unlatching means to resume its unbiased position.

2. A computer assembly according to claim 1, wherein
   a portion of the unlatching means occupies a longitudinal slot in the catch member, and
   in an unlatched and unbiased position, the leading surface on the catch member is substantially coplanar with the leading surface on the unlatching means, and
   in a latched position, the leading surface on the catch member is oblique relative to the leading surface on the unlatching means.

3. A modular computer component which is insertable into a computer housing; said modular computer component including:
   a latch assembly for releasably latching said modular computer component relative to the computer housing,
   said latch assembly comprising:
   (a) a latch body having a first segment and a second segment, wherein said first segment is secured to a sidewall of the component, and said first segment defines an interface surface substantially parallel to the sidewall, and a front end of said first segment extends forward beyond a front panel of the component, and said second segment is integrally joined to said front end of said first segment;
   (b) a resilient stop member anchored to a rear portion of said latch body and including a catch member that extends beyond said interface surface and is designed for releasable engagement with a notch in the computer housing, wherein said catch member includes a first inclined surface and a second inclined surface relative to said interface surface, and said first inclined surface is relatively farther from and slopes away from said front end, and said second inclined surface is relatively nearer to and slopes toward said front end, and said inclined surfaces define therebetween a depth for said catch member that is progressively decreasing as a function of distance from said interface surface, such that an effective portion of said catch member fits within the notch in the computer housing when said modular computer component is inserted into said computer housing, and said catch member is resiliently moveable among a plurality of positions relative to said interface surface, whereby as the component is inserted into the computer housing said first inclined surface contacts a first notch wall of the notch in the computer housing, and said catch member deflects away from the notch, thereby biasing the stop member and allowing said first inclined surface to pass by the first notch wall and the component to proceed further into the computer housing until said second inclined surface encounters the first notch wall and said catch member deflects toward the notch, thereby latching the component in an operative position relative to the computer housing;

(c) a handle member forming an integral part of said second segment, wherein said handle member includes a first flange and a second flange that define a gap therebetween;

(d) an operator lever that is a distinct part relative to said latch body and said stop member, wherein said operator lever includes an operator end and a base end, and said base end is secured to a rear portion of said latch body, and said operator end extends through said gap in said handle member, such that a person can extract the unit with one hand by placing his middle finger behind said first flange and his forefinger behind said second flange, pressing his thumb forcefully against said operator end, and pulling against said flanges; and (e) a light conduit, passing through a portion of said latch body, for conducting light from an interior portion of the component to an exterior portion of the component.

4. A modular computer component which is insertable into a computer housing; said modular computer component including:

a latch assembly for automatically latching said modular computer component in place relative to the housing, said latch assembly comprising:

a latch body secured to a front portion of the modular computer component;

a resilient latching means, operatively connected to the latch body, said latching means including a catch member designed for releasable engagement with a notch in the housing;

said catch member having a leading surface and a trailing surface, the leading surface being relatively farther from and sloping away from a front panel on the component, the catch member being resiliently moveable away from the notch in response to contact between the leading surface and a first notch wall on the housing that defines a wall of the notch; and an unlatching means, operatively connected to the latch body and the latching means, for unlatching the latch body relative to the housing;

the catch member and the unlatching means being cantilevered relative to a rear end of the latch body.

5. A modular computer component according to claim 4, wherein the catch member has a depth as defined between the leading and trailing surfaces, and the depth is progressively decreasing as a function of distance to the notch to ensure within manufacturing tolerances that an effective portion of the catch member can protrude within the notch.

6. A modular computer component according to claim 3, wherein the trailing surface is relatively nearer to and slopes toward the front panel.

7. A modular computer component according to claim 6, wherein the trailing surface is configured with a series of successive square edges designed to selectively engage the first notch wall when the catch mechanism protrudes into the notch.

* * * * *